United States Patent
Achuthan et al.

(10) Patent No.: US 7,077,728 B1
(45) Date of Patent: Jul. 18, 2006

(54) METHOD FOR REDUCING EDGE ARRAY EROSION IN A HIGH-DENSITY ARRAY

(75) Inventors: Krishnashree Achuthan, San Ramon, CA (US); Kashmir Sahota, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/101,285

(22) Filed: Apr. 7, 2005

(51) Int. Cl.
*B24B 7/22* (2006.01)

(52) U.S. Cl. .......................................... 451/41; 451/57
(58) Field of Classification Search ................ 451/36, 451/37, 41, 57; 438/692, 693; 216/88, 89, 216/99
See application file for complete search history.

(56) References Cited

U.S. PATENT DOCUMENTS

| | | | | |
|---|---|---|---|---|
| 5,676,587 A | * | 10/1997 | Landers et al. | 451/57 |
| 6,001,730 A | * | 12/1999 | Farkas et al. | 438/627 |
| 6,083,840 A | * | 7/2000 | Mravic et al. | 438/693 |
| 6,248,002 B1 | * | 6/2001 | Wang et al. | 451/41 |
| 6,261,158 B1 | * | 7/2001 | Holland et al. | 451/63 |
| 6,368,955 B1 | * | 4/2002 | Easter et al. | 438/633 |
| 6,595,832 B1 | * | 7/2003 | Joslyn et al. | 451/41 |

* cited by examiner

*Primary Examiner*—Robert A. Rose
(74) *Attorney, Agent, or Firm*—Farjami & Farjami LLP

(57) ABSTRACT

According to one exemplary embodiment, a method of fabricating an array on a substrate includes forming a layer of a first material adjacent to and over a plurality of segments of a second material on the substrate. The method further includes performing a first CMP process step to form a plurality of segments of the first material, where the plurality of segments of the first material alternate with the plurality of segments of the second material. According to this exemplary embodiment, the method further includes performing a second CMP process step to achieve a target thickness of the plurality of segments of the first material. The first CMP process step comprises a first slurry having particles of a first particle size and the second CMP process step comprises a second slurry having particles of a second particle size, where the second particle size is smaller than the first particle size.

12 Claims, 4 Drawing Sheets

METHOD FOR REDUCING EDGE ARRAY EROSION IN A HIGH-DENSITY ARRAY

TECHNICAL FIELD

The present invention is generally in the field of semiconductor devices. More particularly, the present invention is in the field of fabrication of memory arrays.

BACKGROUND ART

A polishing process, such as a chemical mechanical polishing (CMP) process, is typically used in the formation of an array, such as a memory array, to provide a planar surface to facilitate subsequent processing. During formation of the array, a CMP process is used to provide a planar surface by polishing materials, such as polysilicon and oxide, that have different polish rates (i.e. the rate of removal of the material during the polishing process). This difference in polish rates between the materials in the array during the CMP process can cause undesirable array erosion, which can significantly increase for high-density arrays.

For example, during formation of a high-density array, such as a memory array having a polysilicon segment density greater than approximately 75.0 percent, a conventional CMP process can cause substantial edge array erosion, which can be approximately 100.0 Angstroms or greater. By way of background, in a memory array, edge array erosion refers to the difference between the thickness of a polysilicon segment near the center of the array and the thickness of a polysilicon segment at the edges of the array.

In a conventional CMP process, undesirable array erosion can be reduced by utilizing conventional techniques such as decreasing the pliantness of the polishing pads and/or adjusting the rotary tool parameters used in the CMP process. However, in a conventional CMP process, the conventional techniques discussed above only provide a minimal reduction in edge array erosion in high-density arrays, such as memory arrays having a polysilicon segment density greater than approximately 75.0 percent, caused by a conventional CMP process.

Thus, there is a need in the art for a method of polishing a high-density array, such as a high-density memory array, that provides a significant reduction in undesirable edge array erosion.

SUMMARY

The present invention is directed to method for reducing edge array erosion in a high-density array. The present invention addresses and resolves the need in the art for a method of polishing a high-density array, such as a high-density memory array, that provides a significantly reduction in undesirable edge array erosion.

According to one exemplary embodiment, a method of fabricating an array on a substrate includes forming a layer of a first material adjacent to and over a plurality of segments of a second material on the substrate. The first material can be polysilicon and the second material can be silicon oxide. The first material can have a first polishing rate and the second material can have a second polishing rate, where the first polishing rate is greater than the second polishing rate. The method further includes performing a first CMP process step to form a plurality of segments of the first material, where the plurality of segments of the first material alternate with the plurality of segments of the second material. The density of the plurality of segments of the first material in the array can be greater than approximately 75.0 percent, for example.

According to this exemplary embodiment, the method further includes performing a second CMP process step to achieve a target thickness of the plurality of segments of the first material. The second CMP process step causes edge array erosion of the second material at an edge of the array to be equal to or less than approximately 20.0 Angstroms, for example. The first CMP process step comprises a first slurry having particles of a first particle size and the second CMP process step comprises a second slurry having particles of a second particle size, where the second particle size is smaller than the first particle size. The second particle size may be equal to or less than approximately 15.0 nanometers, for example. Other features and advantages of the present invention will become more readily apparent to those of ordinary skill in the art after reviewing the following detailed description and accompanying drawings.

DETAILED DESCRIPTION OF THE INVENTION

Figure 1:
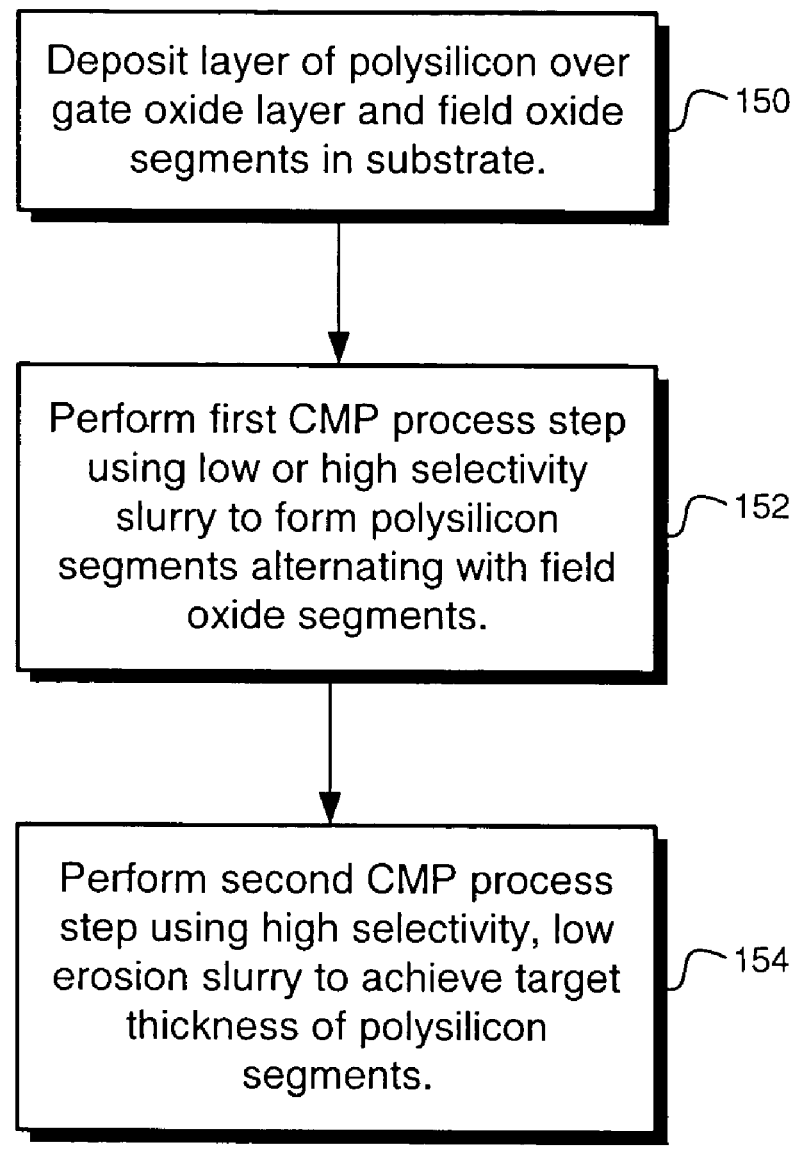
FIG. 1 is a flowchart corresponding to exemplary method steps according to one embodiment of the present invention.

The present invention is directed to method for reducing edge array erosion in a high-density array. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

The present invention involves an innovative two-step CMP process that can be used during fabrication of a high-density array, such as a high-density memory array, to achieve a substantially planar surface with substantially reduced edge array erosion. Although a high-density memory array comprising polysilicon and field oxide segments is utilized in the present embodiment to illustrate the invention, the two-step CMP process of the present invention can be applied to other types of arrays that include segments comprising two different materials with different polish rates. For example, the present invention's two-step CMP process may be applied to an array including conductive segments, which may comprise copper or other appropriate conductive material, and dielectric segments, which may comprise silicon oxide, a dielectric with a low dielectric constant (low-k dielectric) or other appropriate dielectric material.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as is known in the art. While steps 150 through 154 indicated in flowchart 100 are sufficient to describe one embodiment of the present invention, other embodiments of the invention may use steps different from those shown in flowchart 100. It is noted that the processing steps shown in flowchart 100 are performed on a wafer, which, prior to step 150, includes field oxide segments situated in a substrate and a gate oxide layer situated on the substrate.

Figure 2A:
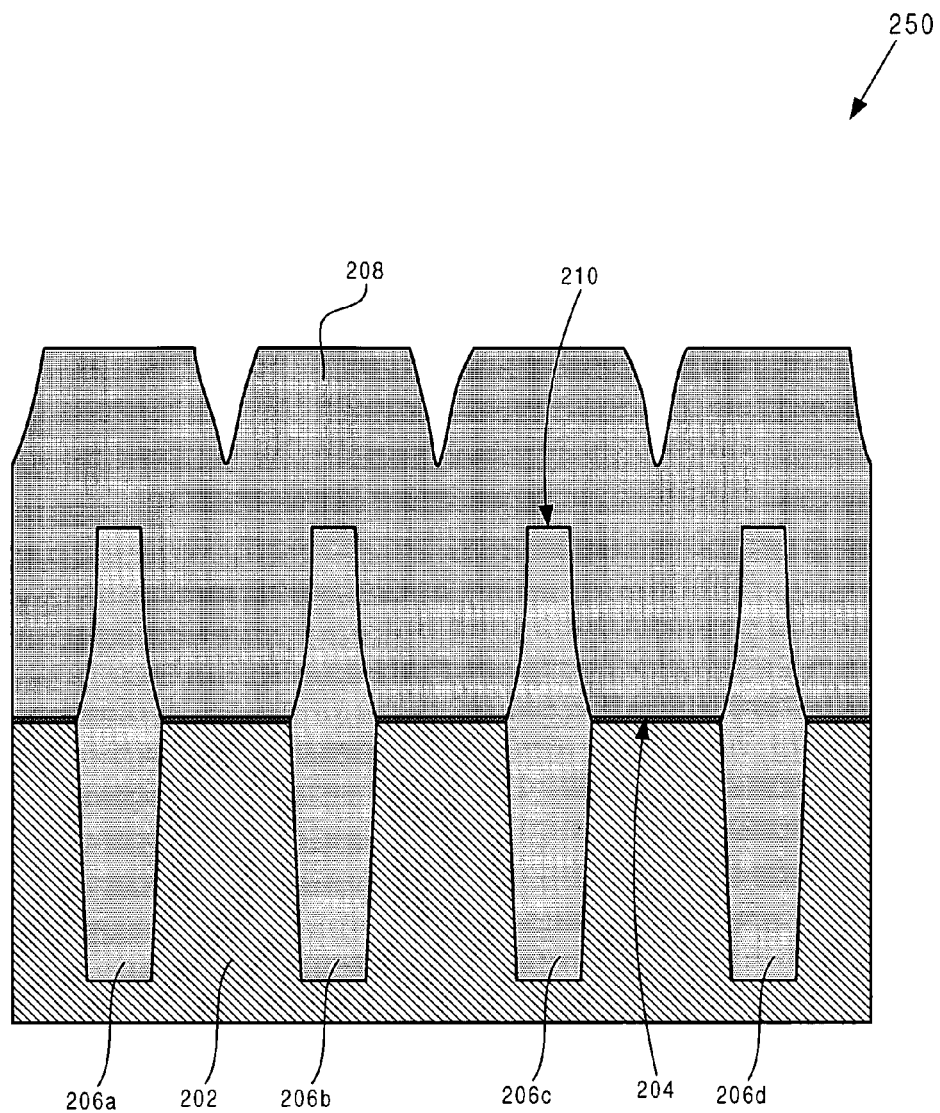
FIG. 2A illustrates a cross-sectional view, which includes portions of an exemplary structure fabricated according to an embodiment of the present invention and a corresponding process step of the flowchart of FIG. 1.
Figure 2B:
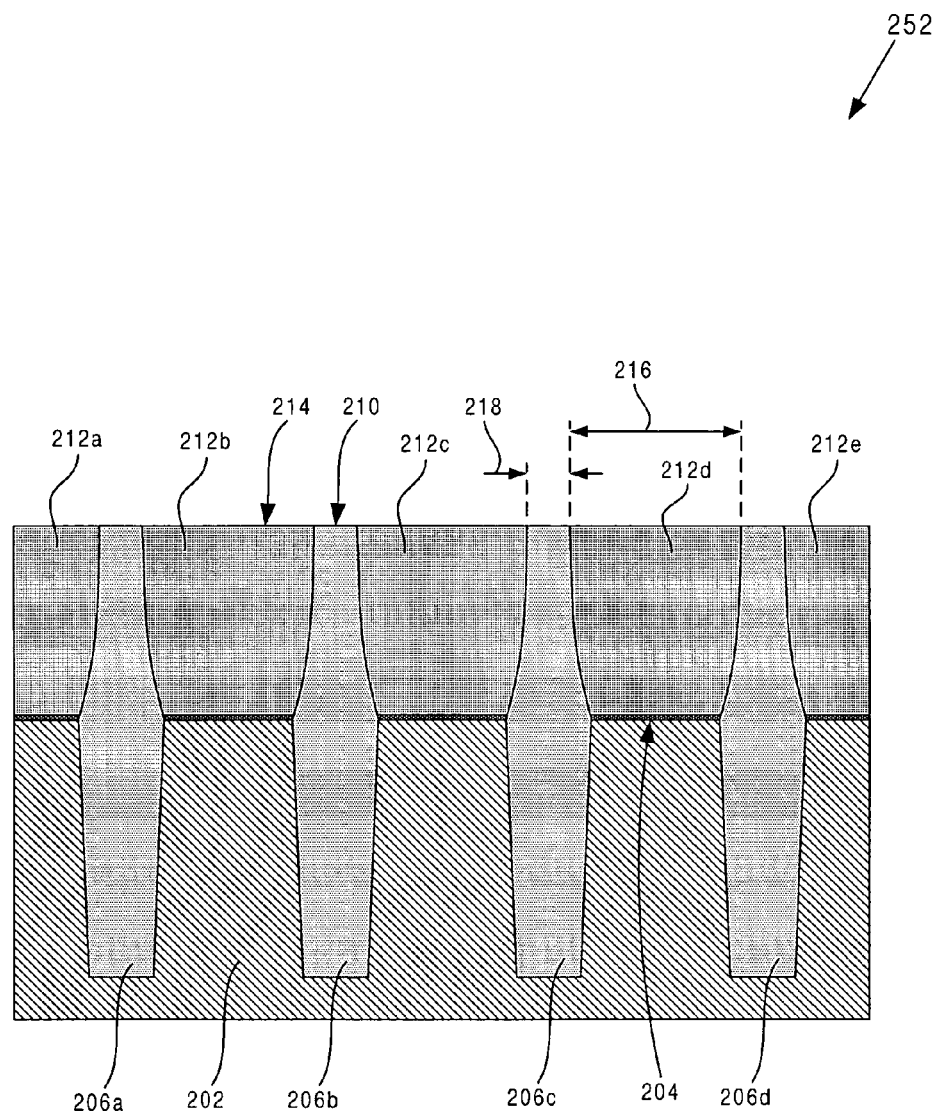
FIG. 2B illustrates a cross-sectional view, which includes portions of an exemplary structure fabricated according to an embodiment of the present invention and a corresponding process step of the flowchart of FIG. 1.
Figure 2C:
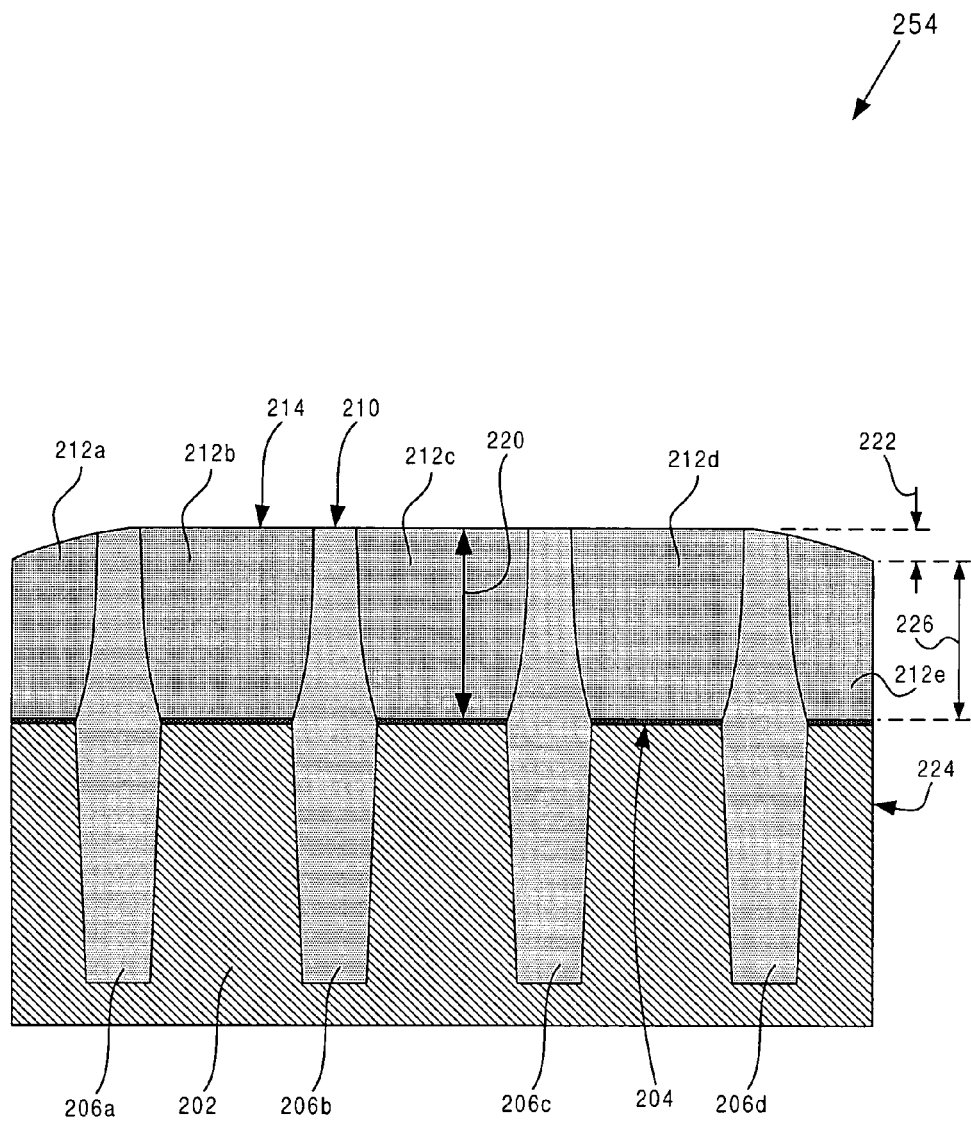
FIG. 2C illustrates a cross-sectional view, which includes portions of an exemplary structure fabricated according to an embodiment of the present invention and a corresponding process step of the flowchart of FIG. 1.

Referring to FIGS. 2A, 2B, and 2C, each of structures 250, 252, and 254 illustrates the result of performing steps 150, 152, and 154, respectively, of flowchart 100 of FIG. 1. For example, structure 250 shows the result of performing step 150, structure 252 shows the result of performing step 152, and so forth.

Reference is now made to step 150 in flowchart 100 of FIG. 1, and the resulting structure 250 in FIG. 2A. Structure 250 is a portion of a structure formed after polysilicon layer 208 has been deposited at step 150, which occurs during fabrication of an exemplary array, such as a memory array, on a substrate. The exemplary array can be a high-density memory array having a polysilicon segment density greater than approximately 75.0 percent. In one embodiment, the exemplary memory array may have a polysilicon segment density equal to or less than approximately 75.0 percent.

Structure 250 includes, among other things, substrate 202 with gate oxide layer 204 situated thereon. Gate oxide layer 204 can comprise silicon oxide, which may be deposited or thermally grown on substrate 202 in a manner known in the art. Structure 250 also includes field oxide segments 206a, b, c, and d, which are situated in substrate 202 and can comprise silicon oxide, such as high-density plasma (HDP) oxide. Field oxide segments 206a, b, c, and d extend above gate oxide layer 204 and can be formed by using an HDP process or other appropriate process.

As stated above, at step 150, polysilicon layer 208 is deposited over gate oxide layer 204 on substrate 202 and adjacent to and over field oxide segments 206a, b, c, and d in substrate 202. Polysilicon layer 208 covers top surfaces 210 of field oxide segments 206a, b, c, and d, comprises polycrystalline silicon (polysilicon), and can be deposited in a chemical vapor deposition (CVD) process or other appropriate processes. It is noted that although only field oxide segments 206a, b, c, and d are shown in FIG. 2A to preserve brevity, structure 250 can include a large number of field oxide segments.

Referring to step 152 in FIG. 1 and structure 252 in FIG. 2B, at step 152 of flowchart 100, a first CMP process step is performed to form polysilicon segments 212a, b, c, d, and e. The first CMP process step forms polysilicon segments 212a, b, c, d, and e by removing a portion of polysilicon layer 208 situated above field oxide segments 206a, b, c, and d using a low or high selectivity, high erosion slurry. As a result of the first CMP process step, top surfaces 214 of polysilicon segments 212 a, b, c, d, and e are substantially planar with top surfaces 210 of field oxide segments 206a, b, c, and d. As shown in FIG. 2B, polysilicon segments 212a, b, c, d, and e alternate with field oxide segments 206a, b, c, and d. For example, field oxide segment 206a is situated between polysilicon segments 212a and 212b, field oxide segment 206b is situated between polysilicon segments 212b and 212c, and so forth.

The first CMP process step is performed using a low or high selectivity, high erosion slurry comprising colloidal silica, which comprises silica particles having a relatively large size. By way of example, the silica particles used in the slurry in the first CMP process step can have a particle size equal to or greater than approximately 30.0 nanometers (nm), where the particle size of the silica particles refers to the approximate diameter of the silica particles. The relatively large size of the silica particles used in the first CMP process step reduces the selectivity and increases the erosion rate of the first CMP process step. Thus, by using relatively large size silica particles in the first CMP process step, polysilicon in polysilicon layer 208 is removed at a correspondingly high rate.

The first CMP process step can be performed using a rotary tool, which can have an exemplary table speed of between approximately 30.0 revolutions per minute (rpm) and approximately 60.0 rpm. In the first CMP process, the downward force exerted by the silica particles can be between approximately 2.0 pounds per square inch (psi) and approximately 4.0 psi, for example. In the present embodiment, the density of polysilicon segments 212a, b, c, d, and e is greater than 75.0 percent in structure 252. In one embodiment, the density of polysilicon segments 212a, b, c, d, and e may be less than or equal to 75.0 percent in structure 252. By way of background, the density of polysilicon segments 212a, b, c, d, and e in structure 252 can be determined by dividing polysilicon segment width 216 by the polysilicon segment pitch, which is equal to the sum of polysilicon segment width 216 and field oxide width 218. It is noted that although only polysilicon segments 212a, b, c, d, and e are shown in FIG. 2B to preserve brevity, structure 252 can include a large number of polysilicon segments alternating with field oxide segments.

Referring to step 154 in FIG. 1 and structure 254 in FIG. 2C, at step 154 of flowchart 100, a second CMP process step is performed using a high selectivity, low erosion slurry to achieve a desired thickness of polysilicon segments 212a, b, c, d, and e. By way of example, polysilicon segment thickness 220, which is the distance between gate oxide layer 204 and top surfaces 214, can be between approximately 400.0 Angstroms and approximately 1500.0 Angstroms. It is noted that polysilicon segment thickness 220 is also referred to as "a target thickness" in the present application. As a result of performing the second CMP process step, the distance between top surfaces 210 of field oxide segments 206a, b, c, and d and gate oxide layer 204 is substantially equal to polysilicon segment thickness 220.

The second CMP process step is performed using a high selectivity, low erosion slurry comprising silica particles having a substantially smaller particle size than the silica particles used in the slurry in the first CMP process step. By way of example, the second CMP process step can be performed using silica particles having a particle size equal to or less than approximately 15.0 nm. By substantially reducing the particle size of the silica particles in the second CMP process step compared to the particle size of the silica particles in the first CMP process step, the selectivity between the material in polysilicon segments 212a, b, c, d, and e, i.e. polysilicon, and the material in field oxide segments 206a, b, c, and d, i.e. silicon oxide, is substantially increased. Although the polishing rate of polysilicon is higher than the polishing rate of silicon oxide, the size of the silica particles in the CMP slurry have a significantly greater affect on the silicon oxide polishing rate than the polysilicon polishing rate.

Thus, by substantially reducing the particle size in the slurry in the second CMP process step, silicon oxide in field oxide segments 206a, b, c, and d is removed at a significantly slower rate than polysilicon in polysilicon segments 212. As a result, the present invention advantageously achieves an array, such as a memory array, having a desired polysilicon segment thickness, i.e. polysilicon segment thickness 220, and substantially reduced edge array erosion, i.e. edge array erosion 222, of a polysilicon segment, such as polysilicon segments 212a and 212e, situated at edge 224 of structure 254. Edge array erosion 222 refers to the difference between the thickness of a polysilicon segment, such as polysilicon segment 212c, near the center of structure 254, and thickness 226 of a polysilicon segment, such as polysilicon segment 212e, at edge 224 of structure 254.

By way of example, edge array erosion 222 in the present invention can be equal to or less than approximately 20.0 Angstroms. In contrast, in a conventional CMP process, edge array erosion can be 100.0 Angstroms or greater. Thus, by utilizing a two-step CMP process including a second CMP process step comprising a slurry having particles with a substantially reduced particle size compared to the particle size of particles in a first CMP process step, the present invention advantageously achieves a reduction in edge array erosion by a factor of five compared to a conventional CMP process. Moreover, the present invention's two-step CMP process achieves a substantially reduced edge array erosion in a high-density array in which the density of the polysilicon segments is greater than approximately 75.0 percent.

By achieving a substantial reduction in edge array erosion, the present invention's two-step CMP process achieves a high-density array in which top surfaces 214 of polysilicon segments 212a, b, c, and d and top surfaces 210 of field oxide segments 206a, b, c, and d are substantially planar. Additionally, by substantially reducing edge array erosion, the present invention's two-step CMP process achieves a substantially increased process margin, which advantageously allows a CMP overpolish step to be performed in other parts of the wafer to remove residues or other types of defects. Furthermore, in the present invention, the second CMP process step functions as a buff slurry step to minimize defects in the array, such as a memory array. By using a high selectivity, low erosion second CMP process step, the present invention can advantageously reduce defects in the array by a factor of between 3.0 and 5.0 compared to a conventional CMP process.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for reducing edge array erosion in a high-density array has been described.

The invention claimed is:

1. A method of fabricating a memory array, said method comprising:
    forming a layer of polysilicon adjacent to and over a plurality of field oxide segments on a substrate;
    performing a first CMP process step to form a plurality of polysilicon segments, said plurality of polysilicon segments alternating with said plurality of field oxide segments;
    performing a second CMP process step to achieve a target thickness of said plurality of polysilicon segments;
    wherein said first CMP process step comprises a first slurry having particles of a first particle size and said second CMP process step comprises a second slurry having particles of a second particle size, wherein said second particle size is smaller than said first particle size.

2. The method of claim 1 wherein said second particle size is equal to or less than approximately 15.0 nanometers.

3. The method of claim 1 wherein said plurality of polysilicon segments has a first polishing rate and said plurality of field oxide segments has a second polishing rate, wherein said first polishing rate is greater than said second polishing rate.

4. The method of claim 1 wherein said second CMP process step causes edge array erosion of at least one of said plurality of polysilicon segments situated at an edge of said memory array to be equal to or less than approximately 20.0 Angstroms.

5. The method of claim 1 wherein a density of said plurality of polysilicon segments in said memory array is greater than approximately 75.0 percent.

6. The method of claim 1 wherein said second CMP process step causes said plurality of field oxide segments to have a slower erosion rate than said plurality of polysilicon segments.

7. The method of claim 1 wherein said first CMP process step has a first selectivity and said second CMP process step has a second selectivity, wherein said second selectivity is higher than said first selectivity.

8. The method of claim 1 wherein said plurality of field oxide segments comprise high-density plasma oxide.

9. The method of claim 1 wherein said plurality of polysilicon segments are situated on a gate oxide layer.

10. The method of claim 1 wherein top surfaces of said plurality of field oxide segments and top surfaces of said plurality of polysilicon segments are substantially planar.

11. A method of fabricating an array on a substrate, said method comprising:
    forming a layer of a first material adjacent to and over a plurality of segments of a second material situated on said substrate;
    performing a first CMP process step to form a plurality of segments of said first material;
    performing a second CMP process step to achieve a target thickness of said plurality of segments of said first material;
    wherein said first CMP process step comprises a first slurry having particles of a first particle size and said second CMP process step comprises a second slurry having particles of a second particle size, and wherein said first material comprises polysilicon.

12. A method of fabricating an array on a substrate, said method comprising:

forming a layer of a first material adjacent to and over a plurality of segments of a second material situated on said substrate;

performing a first CMP process step to form a plurality of segments of said first material;

performing a second CMP process step to achieve a target thickness of said plurality of segments of said first material;

wherein said first CMP process step comprises a first slurry having particles of a first particle size and said second CMP process step comprises a second slurry having particles of a second particle size, and wherein said plurality of segments of said first material are situated on a gate oxide layer.

* * * * *